(12) United States Patent
Singh et al.

(10) Patent No.: US 8,884,194 B2
(45) Date of Patent: Nov. 11, 2014

(54) HEATING PLATE WITH PLANAR HEATER ZONES FOR SEMICONDUCTOR PROCESSING

(71) Applicant: Lam Research Corporation, Fremont, CA (US)

(72) Inventors: Harmeet Singh, Fremont, CA (US); Keith Gaff, Fremont, CA (US); Neil Benjamin, East Palo Alto, CA (US); Keith Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/101,782

(22) Filed: Dec. 10, 2013

(65) Prior Publication Data

US 2014/0096909 A1    Apr. 10, 2014

Related U.S. Application Data

(63) Continuation of application No. 12/582,991, filed on Oct. 21, 2009, now Pat. No. 8,637,794.

(51) Int. Cl.
| | |
|---|---|
| *H05B 3/68* | (2006.01) |
| *H05B 3/00* | (2006.01) |
| *C23C 16/458* | (2006.01) |
| *H01L 21/67* | (2006.01) |
| *C23C 14/54* | (2006.01) |
| *H05B 1/02* | (2006.01) |
| *H05B 3/26* | (2006.01) |
| *H01L 21/3065* | (2006.01) |
| *H01L 21/683* | (2006.01) |

(52) U.S. Cl.
CPC .............. *H05B 3/00* (2013.01); *C23C 16/4586* (2013.01); *H01L 21/67248* (2013.01); *C23C 14/541* (2013.01); *H01L 21/6831* (2013.01); *H01L 21/67103* (2013.01); *H05B 1/0233* (2013.01); *H05B 3/26* (2013.01); *H01L 21/3065* (2013.01); *H01L 21/67109* (2013.01)

USPC .................. 219/444.1; 219/483; 219/487

(58) Field of Classification Search
USPC .............. 219/443.1, 528, 534, 538, 543, 544, 219/553; 361/230–235; 392/434, 438; 216/41
See application file for complete search history.

(56) References Cited

U.S. PATENT DOCUMENTS

| | | | |
|---|---|---|---|
| 3,440,883 | A | 4/1969 | Lightner |
| 5,255,520 | A | 10/1993 | O'Geary et al. |

(Continued)

FOREIGN PATENT DOCUMENTS

| | | | |
|---|---|---|---|
| JP | 2005123286 A | | 5/2005 |
| JP | 2005-294237 A | | 10/2005 |
| KR | 20080058109 A | | 6/2008 |

OTHER PUBLICATIONS

Commonly-Owned Utility U.S. Appl. No. 12/943,492, filed Nov. 10, 2009.

(Continued)

*Primary Examiner* — Brian Jennison
(74) *Attorney, Agent, or Firm* — Buchanan Ingersoll & Rooney PC

(57) ABSTRACT

A heating plate of a semiconductor substrate support for supporting a semiconductor substrate in a plasma processing chamber includes a first layer with an array of heater zones operable to tune a spatial temperature profile on the semiconductor substrate, and a second layer with one or more primary heaters to provide mean temperature control of the semiconductor substrate. The heating plate can be incorporated in a substrate support wherein a switching device independently supplies power to each one of the heater zones to provide time-averaged power to each of the heater zones by time divisional multiplexing of the switches.

20 Claims, 16 Drawing Sheets

(56) References Cited

U.S. PATENT DOCUMENTS

| | | | |
|---|---|---|---|
| 5,414,245 A * | 5/1995 | Hackleman | 219/548 |
| 5,504,471 A | 4/1996 | Lund | |
| 5,515,683 A | 5/1996 | Kessler | |
| 5,536,918 A | 7/1996 | Ohkase et al. | |
| 5,635,093 A | 6/1997 | Arena et al. | |
| 5,665,166 A | 9/1997 | Deguchi et al. | |
| 5,667,622 A | 9/1997 | Hasegawa et al. | |
| 5,740,016 A | 4/1998 | Dhindsa | |
| 5,802,856 A | 9/1998 | Schaper et al. | |
| 5,851,298 A | 12/1998 | Ishii | |
| 5,886,866 A | 3/1999 | Hausmann | |
| 5,994,675 A | 11/1999 | Bethune et al. | |
| 6,060,697 A | 5/2000 | Morita et al. | |
| 6,091,060 A | 7/2000 | Getchel et al. | |
| 6,095,084 A | 8/2000 | Shamouilian et al. | |
| 6,100,506 A | 8/2000 | Colelli, Jr. et al. | |
| 6,175,175 B1 | 1/2001 | Hull | |
| 6,222,161 B1 | 4/2001 | Shirakawa et al. | |
| 6,271,459 B1 | 8/2001 | Yoo | |
| 6,353,209 B1 | 3/2002 | Schaper et al. | |
| 6,403,403 B1 | 6/2002 | Mayer et al. | |
| 6,475,336 B1 | 11/2002 | Hubacek | |
| 6,483,690 B1 | 11/2002 | Nakajima et al. | |
| 6,512,207 B1 | 1/2003 | Dress et al. | |
| 6,523,493 B1 | 2/2003 | Brcka | |
| 6,566,632 B1 | 5/2003 | Katata et al. | |
| 6,612,673 B1 | 9/2003 | Giere et al. | |
| 6,664,515 B2 | 12/2003 | Natsuhara et al. | |
| 6,739,138 B2 | 5/2004 | Saunders et al. | |
| 6,740,853 B1 | 5/2004 | Johnson et al. | |
| 6,741,446 B2 | 5/2004 | Ennis | |
| 6,746,616 B1 | 6/2004 | Fulford et al. | |
| 6,795,292 B2 | 9/2004 | Grimard et al. | |
| 6,815,365 B2 | 11/2004 | Masuda et al. | |
| 6,825,617 B2 | 11/2004 | Kanno et al. | |
| 6,847,014 B1 | 1/2005 | Benjamin et al. | |
| 6,886,347 B2 | 5/2005 | Hudson et al. | |
| 6,921,724 B2 | 7/2005 | Kamp et al. | |
| 6,979,805 B2 | 12/2005 | Arthur et al. | |
| 6,985,000 B2 | 1/2006 | Feder | |
| 6,989,210 B2 | 1/2006 | Gore | |
| 7,075,031 B2 | 7/2006 | Strang et al. | |
| 7,141,763 B2 | 11/2006 | Moroz | |
| 7,143,222 B2 | 11/2006 | Fisher et al. | |
| 7,175,714 B2 | 2/2007 | Ootsuka et al. | |
| 7,206,184 B2 | 4/2007 | Ennis | |
| 7,230,204 B2 | 6/2007 | Mitrovic et al. | |
| 7,250,309 B2 | 7/2007 | Mak et al. | |
| 7,268,322 B2 | 9/2007 | Kuibira et al. | |
| 7,274,004 B2 | 9/2007 | Benjamin et al. | |
| 7,275,309 B2 | 10/2007 | Matsuda et al. | |
| 7,279,661 B2 | 10/2007 | Okajima et al. | |
| 7,297,894 B1 | 11/2007 | Tsukamoto | |
| 7,311,782 B2 | 12/2007 | Strang et al. | |
| 7,372,001 B2 | 5/2008 | Tachikawa et al. | |
| 7,396,431 B2 | 7/2008 | Chen et al. | |
| 7,415,312 B2 | 8/2008 | Barnett, Jr. et al. | |
| 7,475,551 B2 | 1/2009 | Ghoshal | |
| 7,480,129 B2 | 1/2009 | Brown et al. | |
| 7,504,006 B2 | 3/2009 | Gopalraja et al. | |
| 7,782,583 B2 | 8/2010 | Moon | |
| 7,893,387 B2 | 2/2011 | Ohata | |
| 7,940,064 B2 | 5/2011 | Segawa et al. | |
| 7,952,049 B2 | 5/2011 | Tsukamoto | |
| 7,968,825 B2 | 6/2011 | Jyousaka et al. | |
| 8,057,602 B2 | 11/2011 | Koelmel et al. | |
| 8,222,574 B2 | 7/2012 | Sorabji et al. | |
| 2002/0043528 A1 | 4/2002 | Ito | |
| 2002/0159216 A1 | 10/2002 | Ennis | |
| 2002/0185488 A1 | 12/2002 | Natsuhara et al. | |
| 2005/0007136 A1 * | 1/2005 | Feder et al. | 324/760 |
| 2005/0016465 A1 | 1/2005 | Ramaswamy et al. | |
| 2005/0215073 A1 | 9/2005 | Nakamura et al. | |
| 2005/0229854 A1 | 10/2005 | Moroz | |
| 2006/0065367 A1 | 3/2006 | Chen et al. | |
| 2006/0191637 A1 | 8/2006 | Zajac et al. | |
| 2006/0226123 A1 | 10/2006 | Birang | |
| 2007/0125762 A1 | 6/2007 | Cui et al. | |
| 2008/0029195 A1 | 2/2008 | Lu | |
| 2008/0049374 A1 | 2/2008 | Morioka et al. | |
| 2008/0202924 A1 | 8/2008 | Bluck et al. | |
| 2009/0000738 A1 | 1/2009 | Benjamin | |
| 2009/0173445 A1 | 7/2009 | Yeom et al. | |
| 2009/0183677 A1 | 7/2009 | Tian et al. | |
| 2009/0215201 A1 | 8/2009 | Benjamin et al. | |
| 2010/0078424 A1 | 4/2010 | Tsukamoto et al. | |
| 2010/0116788 A1 | 5/2010 | Singh et al. | |
| 2010/0257871 A1 | 10/2010 | Venkatasubramanian et al. | |
| 2010/0283565 A1 | 11/2010 | Blakes | |
| 2011/0005682 A1 | 1/2011 | Savas et al. | |
| 2011/0033175 A1 | 2/2011 | Kasai et al. | |
| 2011/0092072 A1 | 4/2011 | Singh et al. | |
| 2011/0143462 A1 | 6/2011 | Gaff et al. | |

OTHER PUBLICATIONS

Commonly-Owned Utility U.S. Appl. No. 12/910,347, filed Oct. 22, 2010.

International Search Report and Written Opinion mailed Jul. 28, 2011 for PCT/US2010/002794.

Commonly-Owned Utility U.S. Appl. No. 13/234,473, filed Sep. 16, 2011.

Commonly-Owned Utility U.S. Appl. No. 13/237,444, filed Sep. 20, 2011.

Commonly-Owned Utility U.S. Appl. No. 13/238,396, filed Sep. 21, 2011.

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.

* cited by examiner

HEATING PLATE WITH PLANAR HEATER ZONES FOR SEMICONDUCTOR PROCESSING

RELATED APPLICATION

This application is a continuation application under 35 U.S.C. §120 of U.S. patent application Ser. No. 12/582,991 filed on Oct. 21, 2009, the content of which is hereby incorporated in its entirety by reference.

BACKGROUND OF THE DISCLOSURE

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

SUMMARY OF THE INVENTION

In accordance with one embodiment, a heating plate for a substrate support assembly used to support a semiconductor substrate in a semiconductor plasma processing apparatus, comprises at least a first electrically insulating layer, planar heater zones comprising at least first, second, third and fourth planar heater zones laterally distributed across the first electrically insulating layer, electrically conductive power supply lines comprising at least a first power supply line electrically connected to the first and second heater zones and a second power supply line electrically connected to the third and fourth heater zones, electrically conductive power return lines comprising at least a first power return line electrically connected to the first and third heater zones, and a second power return line electrically connected to the second and fourth heater zones.

DETAILED DESCRIPTION

Figure 1:
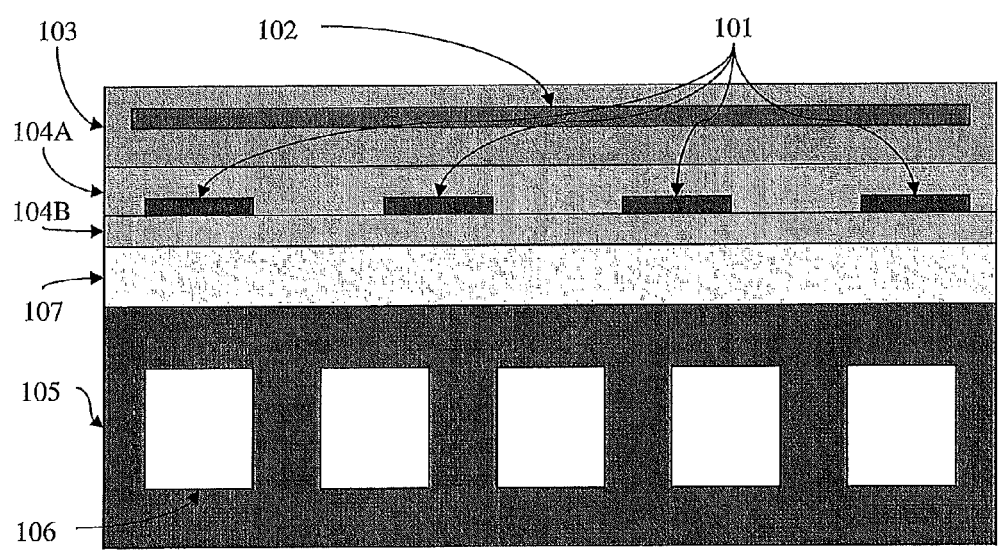
FIG. 1 is a schematic of the cross-sectional view of a substrate support assembly in which a heating plate with an array of heater zones is incorporated, the substrate support assembly also comprising an electrostatic chuck (ESC).

Radial and azimuthal substrate temperature control in a semiconductor processing apparatus to achieve desired critical dimension (CD) uniformity on the substrate is becoming more demanding. Even a small variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and power supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric heater zones to realize step by step and radial temperature control. Typically, the cooling plate is maintained between 0° C. and 30° C. The heaters are located on the cooling plate with a layer of thermal insulator in between. The heaters can maintain the support surface of the substrate support assembly at temperatures about 0° C. to 80° C. above the cooling plate temperature. By changing the heater power within the plurality of heater zones, the substrate support temperature profile can be changed between center hot, center cold, and uniform. Further, the mean substrate support temperature can be changed step by step within the operating range of 0 to 80° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In light of the complex nature of temperature control, it would be advantageous to incorporate multiple independently controllable heater zones in the substrate support assembly to enable the apparatus to actively create and maintain the desired spatial and temporal temperature profile, and to compensate for other adverse factors that affect CD uniformity.

Described herein is a heating plate for a substrate support assembly in a semiconductor processing apparatus with multiple independently controllable heater zones. This heating plate comprises a scalable multiplexing layout scheme of the heater zones and the power supply and power return lines. By tuning the power of the heater zones, the temperature profile during processing can be shaped both radially and azimuthally. Although this heating plate is primarily described for a plasma processing apparatus, this heating plate can also be used in other semiconductor processing apparatuses that do not use plasma.

Also described are methods for manufacturing this heating plate, a substrate support assembly comprising such a heating plate, and methods for powering and controlling a substrate support assembly comprising such a heating plate.

The heater zones in this heating plate are preferably arranged in a defined pattern, for example, a rectangular grid, a hexagonal grid, a polar array, concentric rings or any desired pattern. Each heater zone may be of any suitable size and may have one or more heater elements. All heater elements in a heater zone are turned on or off together. To minimize the number of electrical connections, power supply and power return lines are arranged such that each power supply line is connected to a different group of heater zones and each power return line is connected to a different group of heater zones with each heater zone being in one of the groups connected to a particular power supply line and one of the groups connected to a particular power return line. No two heater zones are connected to the same pair of power supply and power return lines. Thus, a heater zone can be activated by directing electrical current through a pair of power supply and power return lines to which this particular heater zone is connected. The power of the heater elements is preferably smaller than 20 W, more preferably 5 to 10 W. The heater elements may be resistive heaters, such as polyimide heaters, silicone rubber heaters, mica heaters, metal heaters (e.g. W, Ni/Cr alloy, Mo or Ta), ceramic heaters (e.g. WC), semiconductor heaters or carbon heaters. The heater elements may be screen printed, wire wound or etched foil heaters. In one embodiment, each heater zone is not larger than four device dies being manufactured on a semiconductor substrate, or not larger than two device dies being manufactured on a semiconductor substrate, or not larger than one device die being manufactured on a semiconductor substrate, or between 2 and 3 cm$^2$ in area to correspond to the device dies on the substrate. The thickness of the heater elements may range from 2 micrometers to 1 millimeter, preferably 5-80 micrometers. To allow space between heater zones and/or power supply and power return lines, the total area of the heater zones may be up to 90% of the area of the upper surface of the substrate support assembly, e.g. 50-90% of the area. The power supply lines or the power return lines (power lines, collectively) may be arranged in gaps ranging from 1 to 10 mm between the heater zones, or in separate planes separated from the heater zones plane by electrically insulating layers. The power supply lines and the power return lines are preferably made as wide as the space allows, in order to carry large current and reduce Joule heating. In one embodiment, in which the power lines are in the same plane as the heater zones, the width of the power lines is preferably between 0.3 mm and 2 mm. In another embodiment, in which the power lines are on different planes than the heater zones, the width of the power lines can be as large as the heater zones, e.g. for a 300 mm chuck, the width can be 1 to 2 inches. The materials of the power supply and power return lines may be the same as or different from the materials of the heater elements. Preferably, the materials of the power supply and power return lines are materials with low resistivity, such as Cu, Al, W, Inconel® or Mo.

Figure 2:
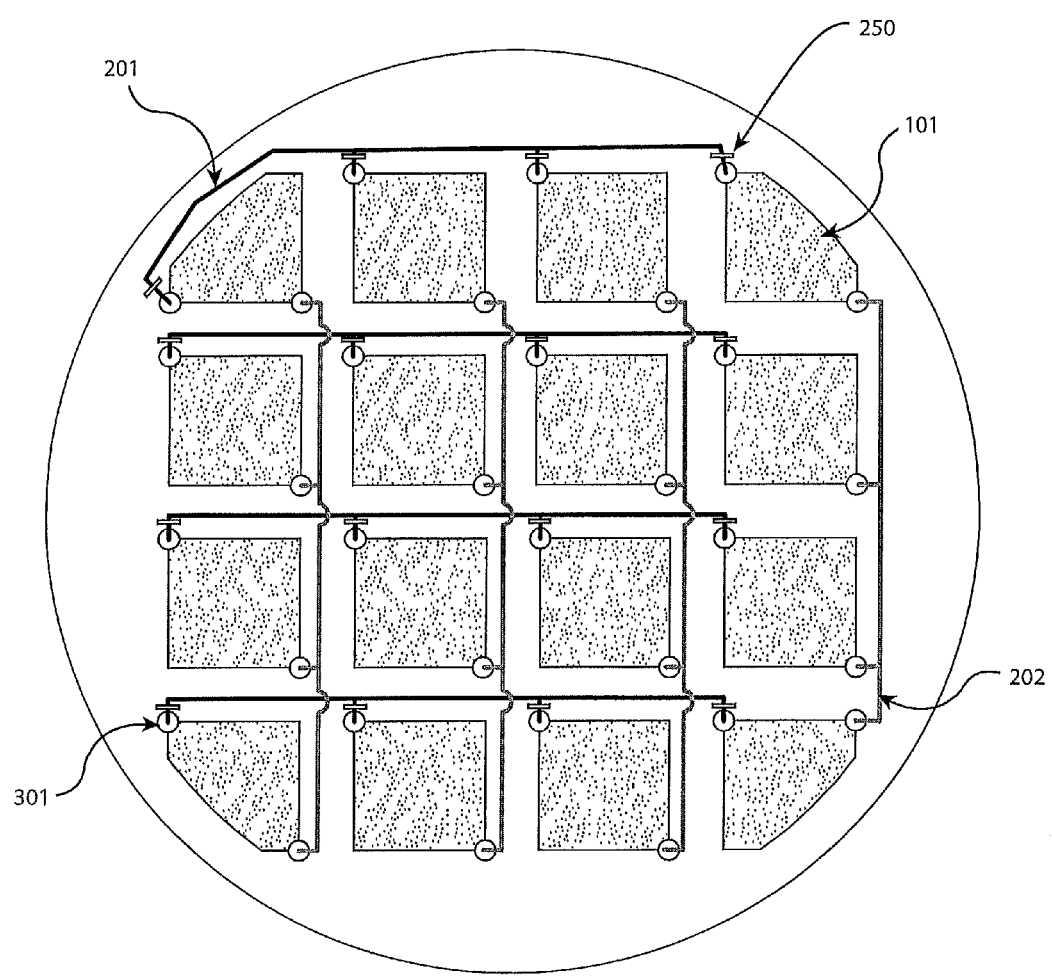
FIG. 2 illustrates the topological connection between power supply and power return lines to an array of heater zones in one embodiment of a heating plate which can be incorporated in a substrate support assembly.

FIGS. 1-2 show a substrate support assembly comprising one embodiment of the heating plate having an array of heater zones 101 incorporated in two electrically insulating layers 104A and 104B. The electrically insulating layers may be a polymer material, an inorganic material, a ceramic such as silicon oxide, alumina, yttria, aluminum nitride or other suitable material. The substrate support assembly further comprises (a) an ESC having a ceramic layer 103 (electrostatic clamping layer) in which an electrode 102 (e.g. monopolar or bipolar) is embedded to electrostatically clamp a substrate to the surface of the ceramic layer 103 with a DC voltage, (b) a thermal barrier layer 107, (c) a cooling plate 105 containing channels 106 for coolant flow.

As shown in FIG. 2, each of the heater zones 101 is connected to one of the power supply lines 201 and one of the power return lines 202. No two heater zones 101 share the same pair of power supply 201 and power return 202 lines. By suitable electrical switching arrangements, it is possible to connect a pair of power supply 201 and power return 202 lines to a power supply (not shown), whereby only the heater zone connected to this pair of lines is turned on. The time-averaged heating power of each heater zone can be individually tuned by time-domain multiplexing. In order to prevent crosstalk between different heater zones, a rectifier 250 (e.g. a diode) may be serially connected between each heater zone and the power supply lines connected thereto (as shown in FIG. 2), or between each heater zone and the power return lines connected thereto (not shown). The rectifier can be physically located in the heating plate or any suitable location. Alternatively, any current blocking arrangement such as solid state switches can be used to prevent crosstalk.

Figure 3A:
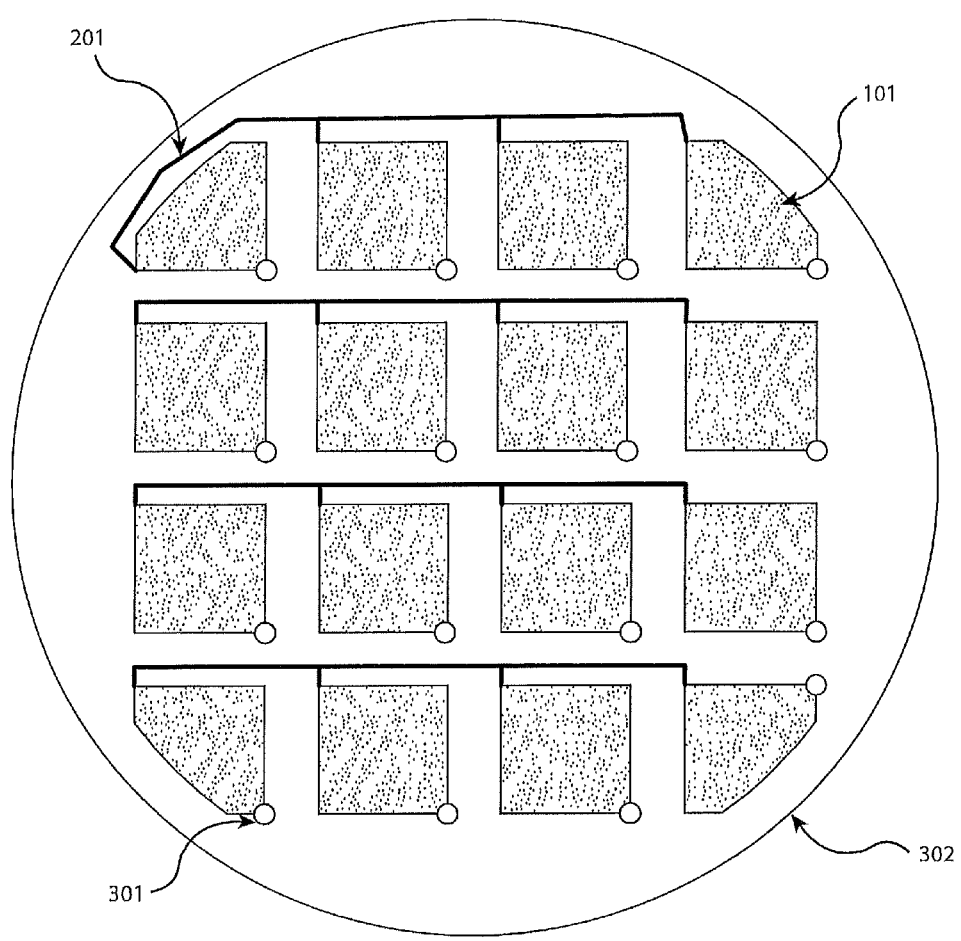
FIG. 3A shows an embodiment wherein the power supply lines and the heater zones are on the same plane.
Figure 3B:
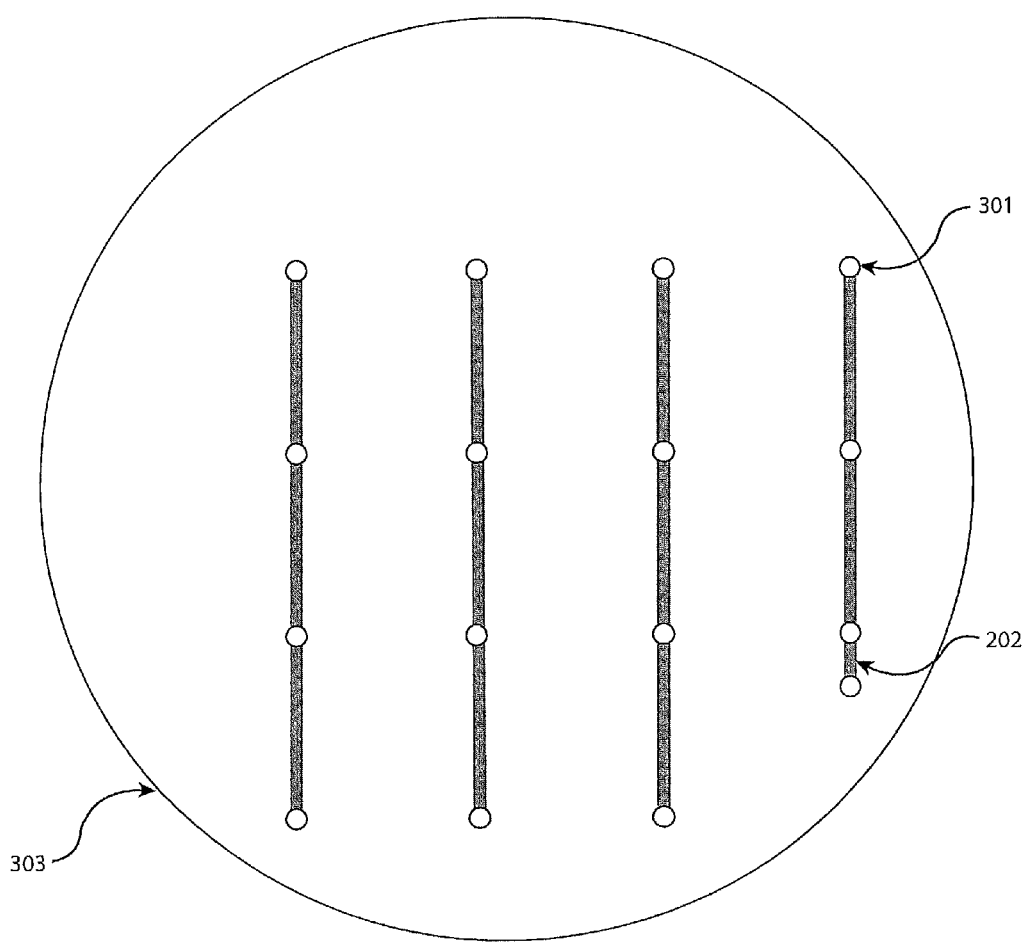
FIG. 3B shows the power return lines on a plane separated from the plane in FIG. 3A by an electrically insulating layer and the power return lines are connected to the heater zones through vias extending through the electrically insulating layer.
Figure 3C:
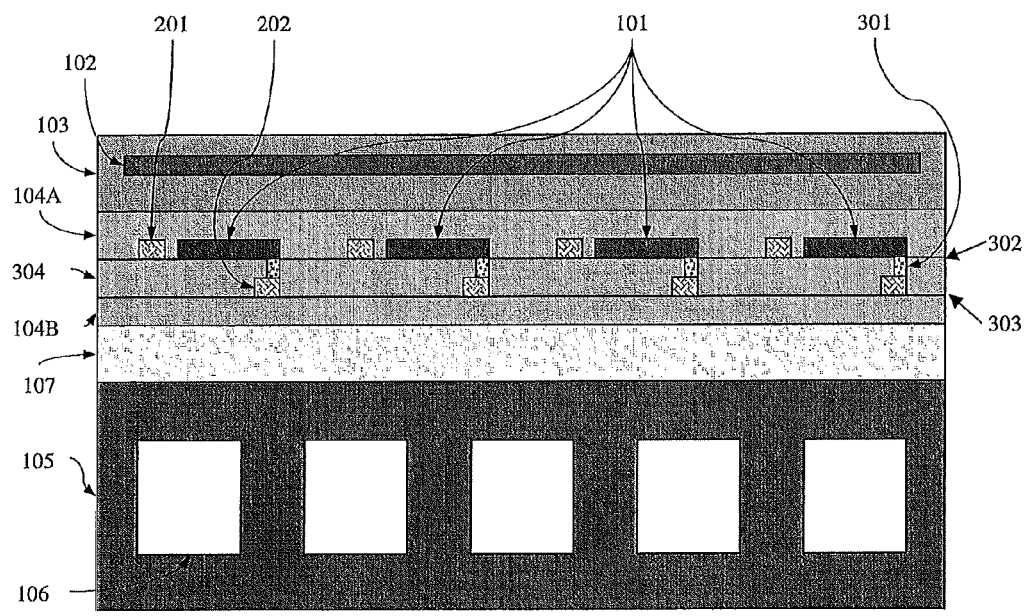
FIG. 3C is a schematic of the cross-sectional view of a substrate support assembly in which the heating plate of FIGS. 3A and 3B is incorporated.

FIGS. 3A, 3B and 3C show a substrate support assembly comprising an ESC, a cooling plate, and one embodiment of the heating plate wherein the heater zones 101 and power supply lines 201 are arranged in a first plane 302, and the power return lines 202 are arranged in a second plane 303 separated from the first plane 302 by an electrically insulating layer 304. The power return lines 202 are connected to the heater zones 101 by conductive vias 301 in the electrically insulating layer 304, extending between the first plane 302 and the second plane 303.

Figure 4A:
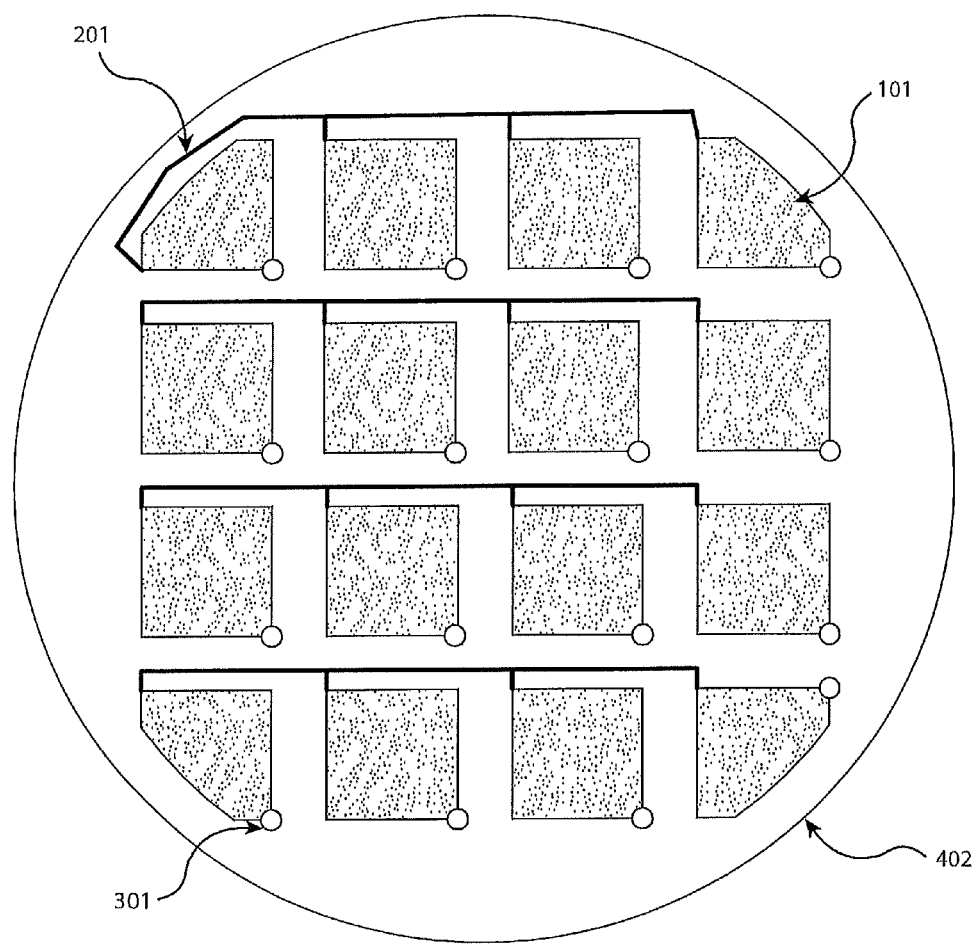
FIG. 4A shows an embodiment wherein the power supply lines and the heater zones are on the same plane.
Figure 4B:
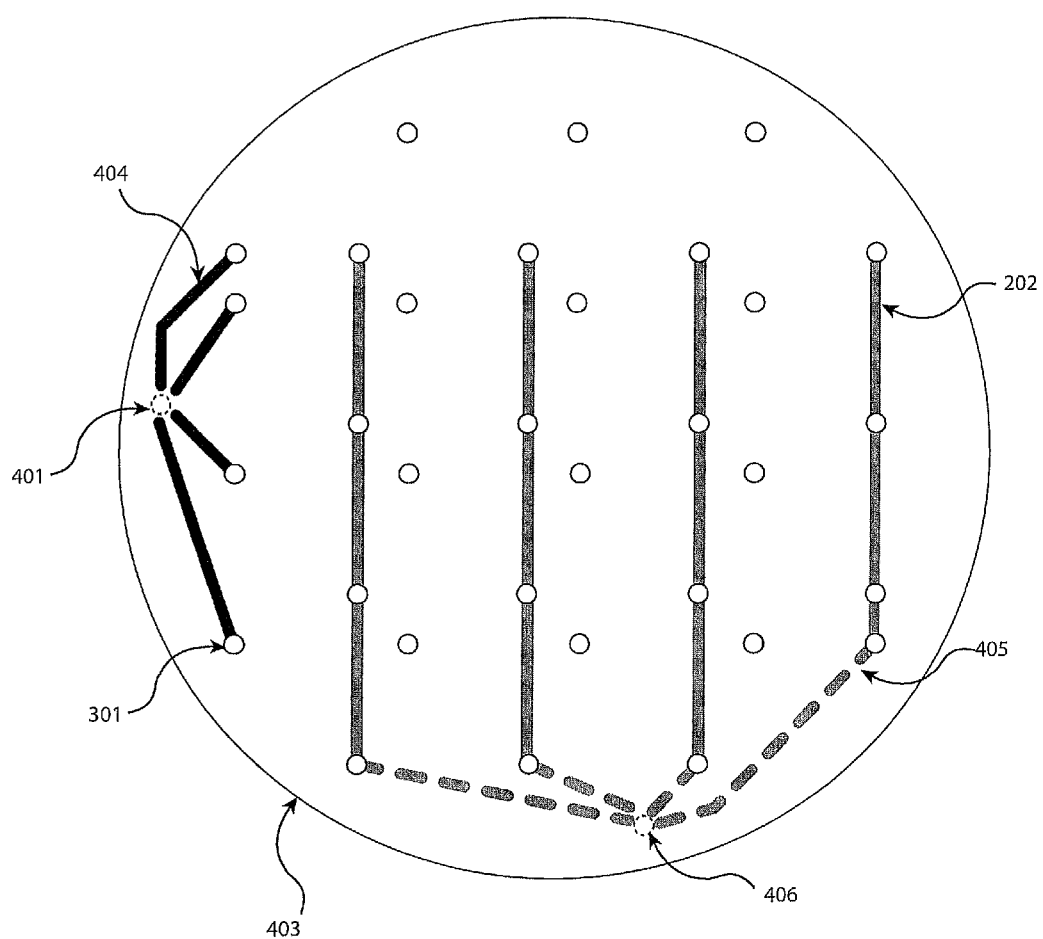
FIG. 4B shows a plane separated from the plane in FIG. 4A by an electrically insulating layer wherein the power supply lines are connected to leads in this plane through vias, and brought to a single hole in the cooling plate (not shown). The power return lines on this plane are connected to the heater zones through vias extending between this plane and the plane in FIG. 4A. The power return lines are also brought to a single hole in the cooling plate (not shown).

In use, the power supply lines 201 and power return lines 202 are connected to circuitry external to the heating plate through holes or conduits in the cooling plate. It should be appreciated that the presence of holes or conduits in the cooling plate can affect the temperature uniformity of substrate support assembly adversely, therefore reducing the number of holes or conduits in the cooling plate can enhance temperature uniformity. In addition, a small number of holes makes placing them around the edge of the substrate support assembly possible. For example, a single power supply conduit in the cooling plate can be used to feed electrical leads to the power supply lines 201. In one embodiment (FIGS. 4A and 4B), the heater zones 101 and power supply lines 201 are arranged in a first plane 402. The power supply lines 201 are connected to leads 404 in a second plane 403 through conductive vias 301 extending between the first plane 402 and the second plane 403. The second plane 403 is separated from the first plane 402 by an electrically insulating layer (not shown). The power return lines 202 are arranged in the second plane 403 and are connected to the heater zones 101 through conductive vias 301 extending between the first plane 402 and the second plane 403. In the second plane 403, the leads 404 are brought through a hole or conduit 401 in the cooling plate while maintaining electrical insulation between the leads. Similarly, the power return lines 202 are connected to leads 405 brought through a hole or conduit 406 in the cooling plate while maintaining electrical insulation between the leads 405.

Figure 5A:
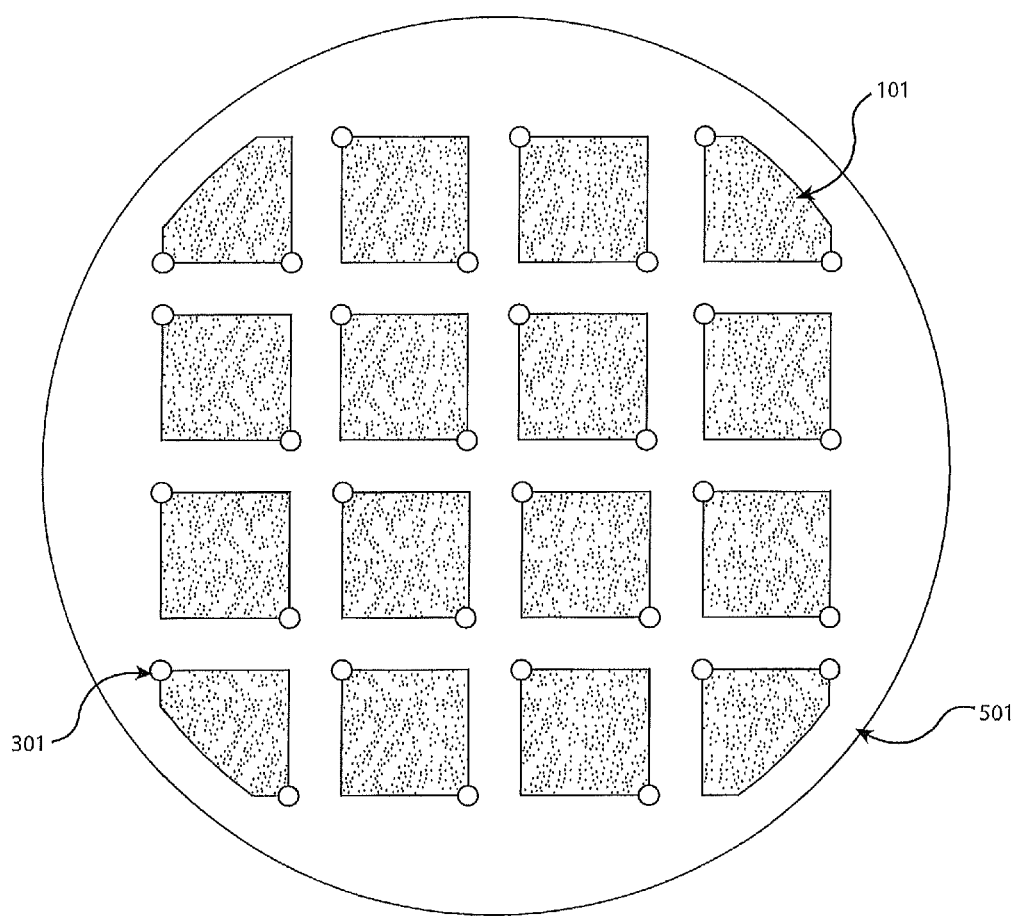
FIG. 5A shows an embodiment wherein the heater zones are on a plane without the power supply lines or power return lines on that plane. The heater zones are connected to power supply lines and power return lines on one or more different planes through vias.
Figure 5B:
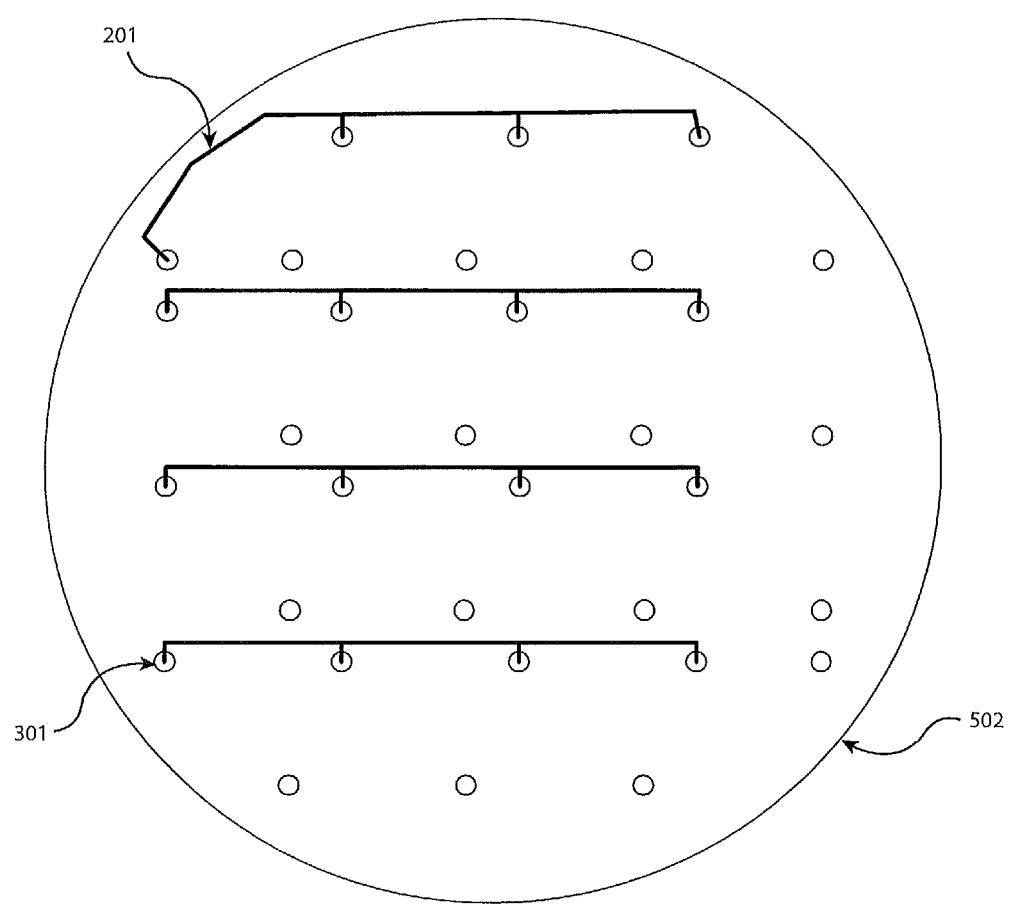
FIG. 5B shows the power supply lines on a second plane separated from the plane in FIG. 5A by an electrically insulating layer. The power supply lines are connected to the heater zones through vias extending between the two planes in FIGS. 5A and 5B.
Figure 5C:
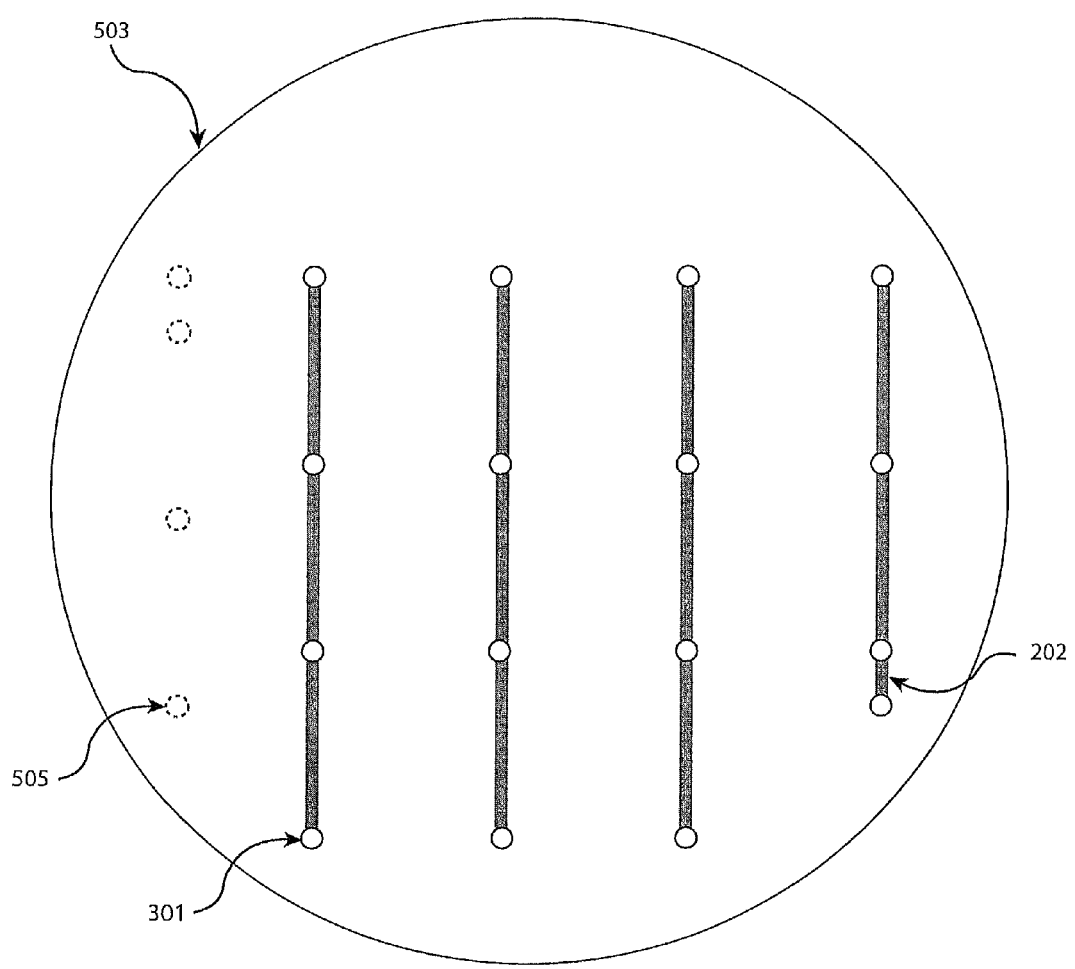
FIG. 5C shows the power return lines on a third plane separated from the planes in FIGS. 5A and 5B by another electrically insulating layer. The power return lines are connected to the heater zones through vias extending between all three planes in FIG. 5A-C. The leads connected to the power supply lines in FIG. 5B are also routed through feedthroughs in this plane.
Figure 5D:
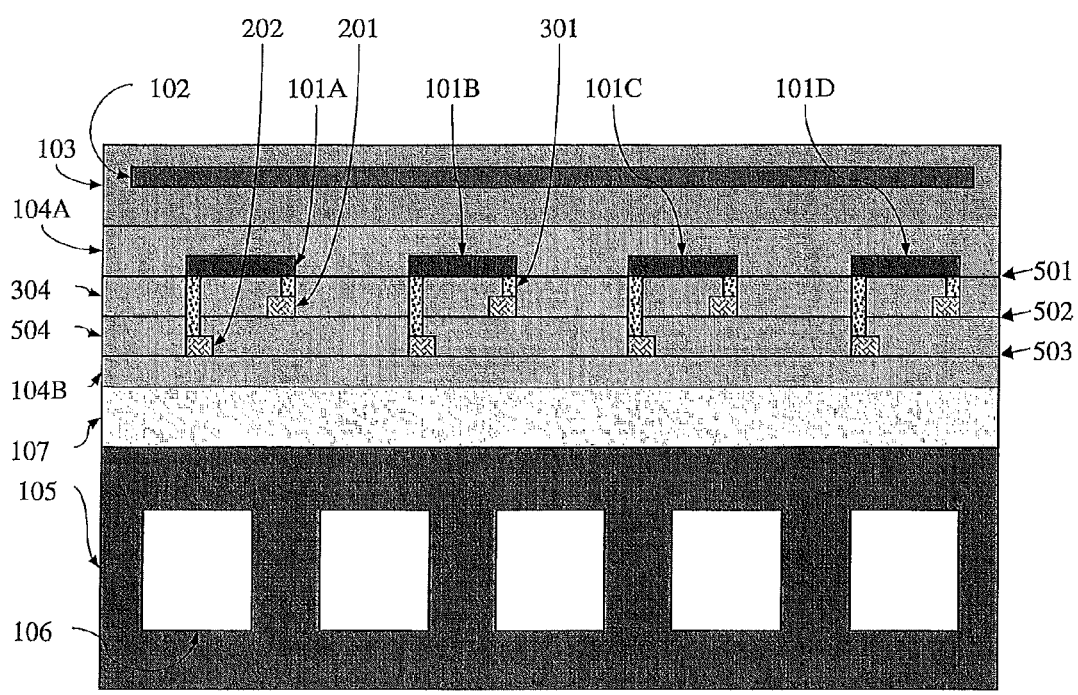
FIG. 5D is a schematic of the cross-sectional view of a substrate support assembly in which the heating plate in FIG. 5A-C is incorporated.
Figure 5E:
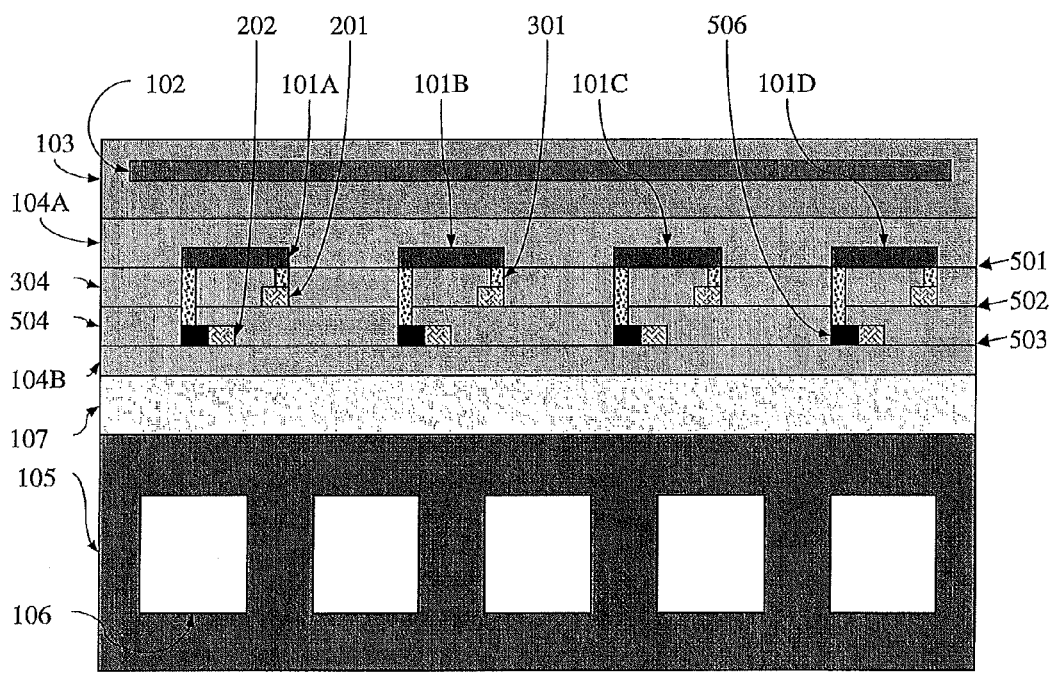
FIG. 5E is a schematic of the cross-sectional view of a substrate support assembly in which an alternative heating plate in FIG. 5A-C is incorporated.

FIGS. 5A, 5B, 5C and 5D show a substrate support assembly comprising yet another embodiment of the heating plate, the heater zones 101 are arranged in a first plane 501; the power supply lines 201 are arranged in a second plane 502; and the power return lines 202 are arranged in a third plane 503. The first plane 501, second plane 502 and third plane 503 are separated from each other by electrically insulating layers 504 and 304. The power supply lines 201 and power return lines 202 are connected to the heater zones 101 through conductive vias 301 in the electrically insulating layers 304 and 504, extending between the planes 501, 502 and 503. Leads (not shown) connected to the power supply lines 201 are routed through holes or conduits 505 in the layer 504. It should be appreciated that the planes 501, 502 and 503 may be arranged in any order in the vertical direction, provided that the vias and conduits are suitably arranged. Preferably, the heaters are arranged closest to the substrate support assembly upper surface. FIG. 5E shows an embodiment wherein each heater zone 101 is connected to the power return line 202 through a rectifier 506 (e.g. a diode). The rectifier 506 only allows electric current flowing from the power supply line 201 through the heater zone 101 to the power return line 202, and thus prevents crosstalk between heater zones.

Figure 6:
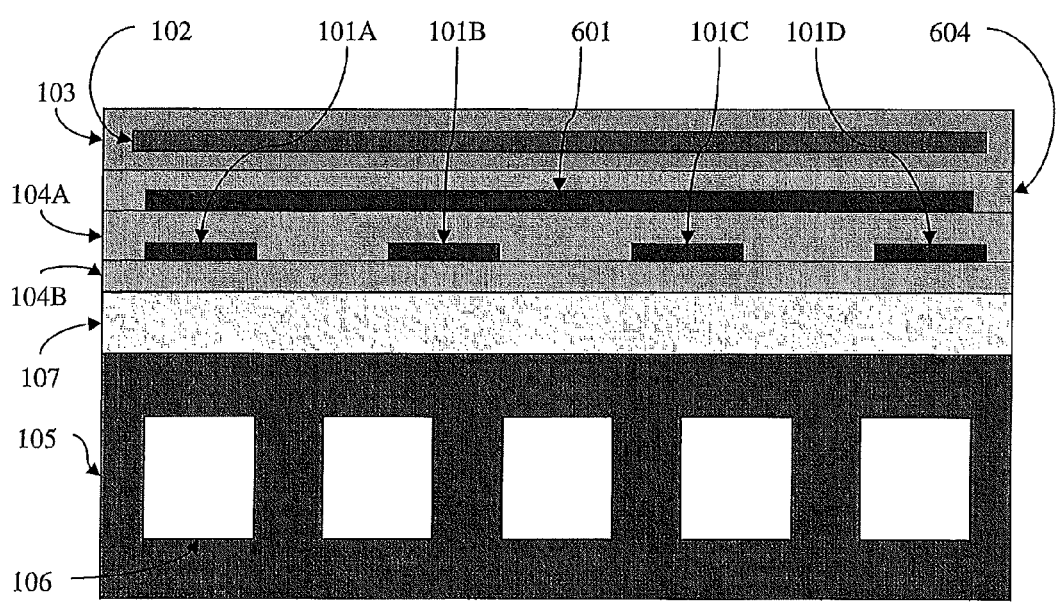
FIG. 6 is a schematic of the cross-sectional view of a substrate support assembly in which a heating plate is incorporated, the substrate support assembly further including a primary heater layer above the array of heater zones, the primary heater located on an additional plane separated from all the planes in the heating plate by an electrically insulating layer.

The substrate support assembly can comprise an additional electrically insulating layer 604 in which one or more additional heaters (hereafter referred to as primary heaters 601) are incorporated (FIG. 6). Preferably, the primary heaters 601 are individually controlled high-power heaters. The power of the primary heaters is between 100 and 10000 W, preferably, between 1000 and 5000 W. The primary heaters may be arranged as a rectangular grid, concentric annular zones, radial zone or combination of annular zones and radial zones. The primary heaters may be used for changing the mean temperature, tuning the radial temperature profile, or step-by-step temperature control on the substrate. The primary heaters may be located above or below the heater zones of the heating plate.

In one embodiment, at least one of the insulating layers in the heating plate is a sheet of polymer material.

In another embodiment, at least one of the insulating layers in the heating plate is a sheet of inorganic material such as ceramic or silicon oxide. Examples of suitable insulating and conductive material for use in manufacture of ceramic chucks are disclosed in commonly assigned U.S. Pat. No. 6,483,690, the disclosure of which is hereby incorporated by reference.

A substrate support assembly can comprise an embodiment of the heating plate, wherein each heater zone of the heating plate is of similar size to or smaller than a single device die or group of device dies on the substrate so that the substrate temperature, and consequently the plasma etching process, can be controlled for each device die position to maximize the yield of devices from the substrate. The scalable architecture of the heating plate can readily accommodate the number of heater zones required for die-by-die substrate temperature control (typically more than 100 dies on a substrate of 300-mm diameter) with minimal number of power supply lines, power return lines, and feedthroughs in the cooling plate, thus reduces disturbance to the substrate temperature, the cost of manufacturing and complexity of the substrate support assembly. Although not shown, the substrate support assembly can comprise features such as lift pins for lifting the substrate, helium back cooling, temperature sensors for providing temperature feedback signals, voltage and current sensors for providing heating power feedback signals, power feed for heaters and/or clamp electrode, and/or RF filters.

In one embodiment of the method for manufacturing the heating plate, where the insulating layers are ceramic, the insulating layers may be formed by depositing the ceramic on a suitable substrate using techniques such as plasma spraying, chemical vapor deposition or sputtering. This layer can be an initial starting layer or one of the insulating layers of the heating plate.

In one embodiment of the method for manufacturing the heating plate, where the insulating layers are ceramic, the insulating layers may be formed by pressing a mixture of ceramic powder, binder and liquid into sheets and drying the sheets (hereafter referred as green sheets). The green sheets can be about 0.3 mm in thickness. The vias may be formed in the green sheets by punching holes in the green sheets. The holes are filled with a slurry of conducting powder. The heater elements, power supply and power return lines may be formed by: screen printing a slurry of conducting powder (e.g. W, WC, doped SiC or $MoSi_2$), pressing a precut metal foil, spraying a slurry of conducting powder, or any other suitable technique. Recesses for accommodating any rectifiers such as diodes may be pressed during the forming process of the green sheets or cut in the green sheets after the forming process. Discrete component rectifiers may be mounted into these recesses. Multiple green sheets with a variety of components (power lines, vias, rectifiers and heater elements) are then aligned, pressed and sintered to form an entire heating plate.

In another embodiment of the method for manufacturing the heating plate, where the insulating layers are ceramic, the insulating layers may be formed by pressing a mixture of ceramic powder, binder and liquid into green sheets and drying the green sheets. The green sheets can be about 0.3 mm in thickness. Holes are punched in the green sheets for accommodating vias. Recesses for accommodating any rectifiers such as diodes may be pressed during the forming process of the green sheets or cut in the green sheets after the forming process. Then, individual green sheets are sintered. The holes in the sintered sheets for accommodating vias are filled with a slurry of conducting power. The heater elements, power supply and power return lines may be screen printed with a slurry of conducting powder (e.g. W, WC, doped SiC or $MoSi_2$), or be formed using any other suitable technique, on the sintered sheets. Discrete component rectifiers may be mounted into the recesses in the sintered sheets. Multiple sintered sheets with a variety of components (lines, vias, rectifiers and heater elements) are then aligned and bonded with an adhesive to form an entire heating plate.

In one embodiment where the insulating layers are silicon oxide sheets, the insulating layers may be formed by depositing a thin film silicon oxide onto a suitable substrate using techniques such as evaporation, sputtering, PVD, CVD, PECVD.

In one preferred embodiment of the method for manufacturing the heating plate, a thin metal sheet (component layer) such as Al, Inconel® or Cu foil, is bonded (e.g. heat pressed, adhered with adhesive) to a first polymer film such as polyimide. A patterned resist film is applied to the surface of the component layer wherein the patterns define the shapes and positions of the electrical components such as heater elements, power supply lines or power return lines. The exposed metal is chemically etched and the resist pattern is retained in the remaining metal sheet. The resist is then removed by dissolution in a suitable solvent or dry stripping. A second polymer film with holes for accommodating vias (via layer) is aligned and bonded to the first polymer film. The sidewalls of the holes may be coated by plating metal therein. Any suitable number of component layers and via layers may be incorporated serially. Finally, exposed metal components are covered by a continuous polymer film for electrical insulation.

In another embodiment, the heater elements, power supply and power return lines are made of metal films deposited (e.g. plasma sprayed, electroplated, chemical vapor deposition, or sputtered) on an insulating layer or substrate (e.g. a green sheet).

In another embodiment, the heater elements, power supply and power return lines are made of a thin layer of amorphous conductive inorganic film such as indium tin oxide deposited (e.g. electroplated, chemical vapor deposition, or sputtered) on an insulating layer or substrate (e.g. a green sheet).

In yet another embodiment, the heater elements, power supply and power return lines are made of a thin layer of conductive ceramic film deposited (e.g. chemical vapor deposition, or sputtered) on an insulating layer or substrate (e.g. a green sheet).

In one embodiment, the power supply and power return lines in the heating plate may be connected to the external circuitry by terminal connectors such as spring tipped passthroughs embedded in but electrically insulated from the cooling plate.

In another embodiment, the power supply and power return lines in the heating plate may be connected to the external circuitry by attaching (soldered, bonded with conductive adhesive or spot welded) lead wires to the power supply and power return lines and threading these lead wires through holes or conduits in the cooling plate.

In a plasma processing system, the RF power applied in the plasma processing chamber is usually above 100 W, sometimes above 1000 W. The amplitude of RF voltages can exceed a kilovolt. Such strong RF power can easily affect the operation of the control and power circuit of the heater zones without proper filtration or isolation. An RF filter can be used to shunt the RF power away from the control and power circuit. An RF filter may be a simple broad-band filter or a tuned-filter for the specific RF frequencies used in the plasma processing system. An RF isolator, in contrast, eliminates direct electrical connection between any RF-coupled components and the control and power circuit. An RF isolator may be an optical coupler or a transformer.

Figure 7A:
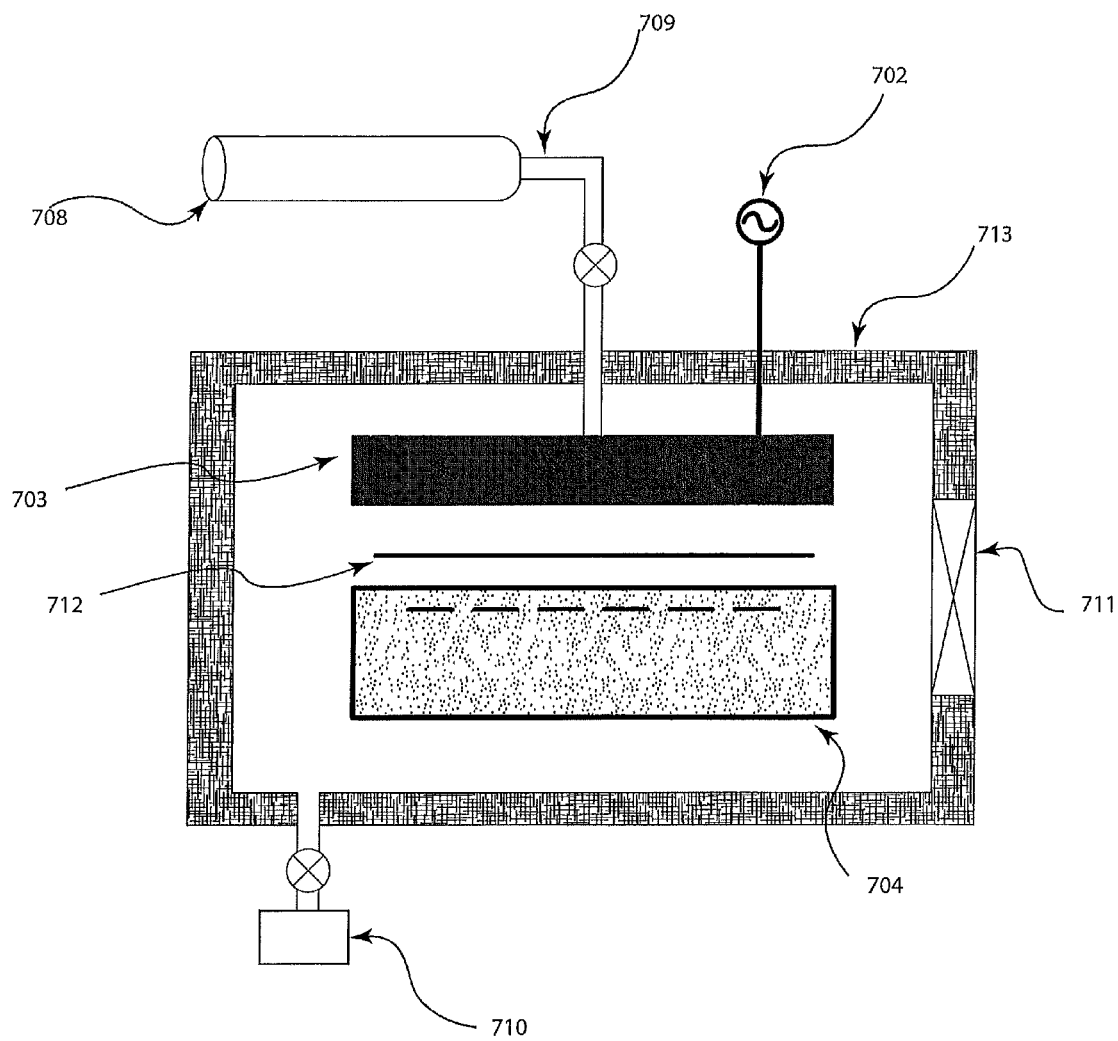
FIG. 7A is a schematic of an exemplary plasma processing chamber, which can include a substrate support assembly with the heating plate described herein.

As an overview of how a plasma processing chamber operates, FIG. 7A shows a schematic of a plasma processing chamber comprising a chamber 713 in which an upper showerhead electrode 703 and a substrate support assembly 704 are disposed. A substrate 712 is loaded through a loading port 711 onto the substrate support assembly 704. A gas line 709 supplies process gas to the upper showerhead electrode 703 which delivers the process gas into the chamber. A gas source 708 (e.g. a mass flow controller power supplying a suitable gas mixture) is connected to the gas line 709. A RF power source 702 is connected to the upper showerhead electrode 703. In operation, the chamber is evacuated by a vacuum pump 710 and the RF power is capacitively coupled between the upper showerhead electrode 703 and a lower electrode in the substrate support assembly 704 to energize the process gas into a plasma in the space between the substrate 712 and the upper showerhead electrode 703. The plasma can be used to etch device die features into layers on the substrate 712. The substrate support assembly 704 may have heaters incorporated therein. It should be appreciated that while the detailed design of the plasma processing chamber may vary, RF power is coupled through the substrate support assembly 704.

Figure 7B:
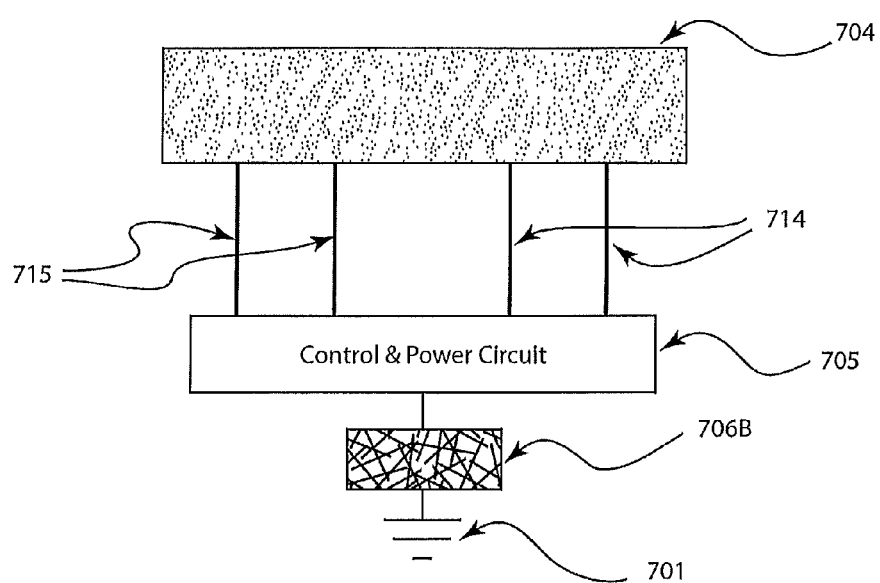
FIG. 7B is a schematic of an RF isolation approach.

FIG. 7B shows a schematic of an embodiment of RF filtration or isolation, wherein no filters or isolators are connected on the heater zone power supply and power return lines and the control and power circuit 705 is connected to a filter or isolator 706B, which is connected to the electric ground 701. The primary heaters (not shown), if present in the substrate support assembly, preferably have separate filters or isolators due to their high power. In this approach, the control and power circuit 705 floats at the RF potential or "high side". This approach allows multiple heater zones to share only one filter or isolator.

All the high side circuitry can be housed inside a local floating Faraday cage immediately under the substrate support assembly base structure.

Alternatively, an isolation transformer is used as the single filter or isolator 706B to isolate the power and control circuitry 705 from the RF. The control and power circuitry 705 of the heater zones should be capable of operating at relatively high frequency (25 to 250 KHz) because the transformer strongly attenuates DC and low frequency transmission. The control and power circuitry is referenced to a single floating potential (floating ground). This requires that the control and power circuitry connected to this isolation transformer must be subject to very similar RF exposure. If the RF potentials differ substantially between two groups of control and power circuits, significant RF current flows between these groups. In this scenario, each group must have its own filter or isolator, or there must be a filter or isolator between these groups.

The filter or isolator 706B may be physically located in the plasma processing chamber or any other suitable location.

Figure 8:
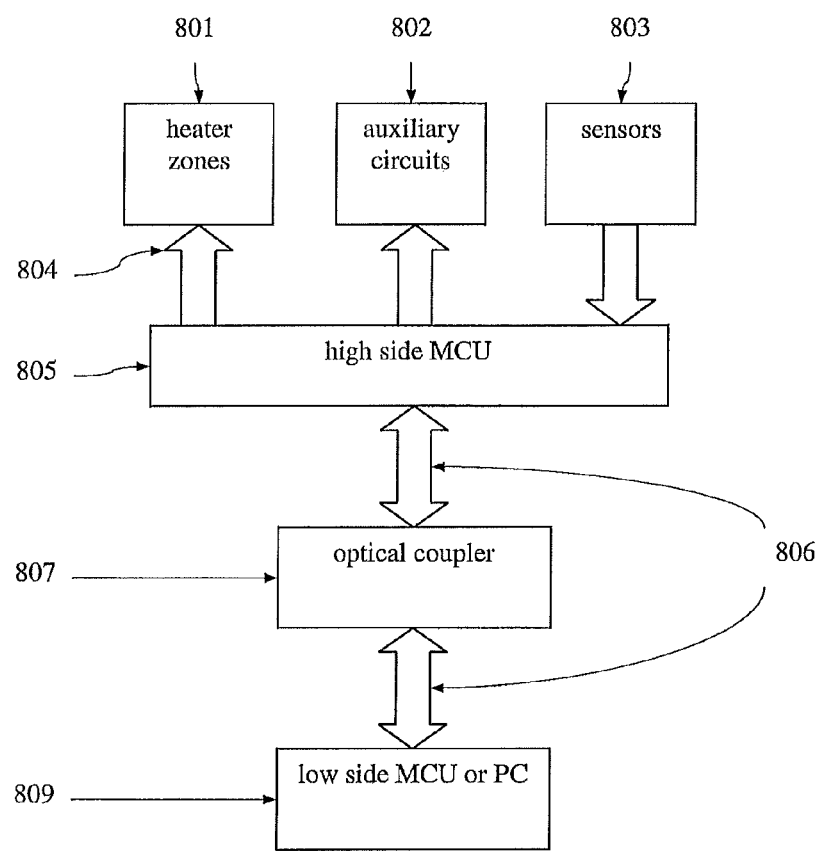
FIG. 8 shows a block diagram of signal flow in one embodiment of the control electronics for the substrate support assembly.

One embodiment of the heater control electronics is depicted in FIG. 8. A low side controller 809 may be a microcontroller unit (MCU) or a higher level device such as a computer (PC). Through an optical coupler 807, the low side controller communicates digitally to the high side MCU 805 which interacts with the heater zones 801, sensors 803, and any auxiliary circuits 802. If the high side MCU 805 has sufficient capability and local memory, any set-point and program may be preloaded into the high side MCU 805 before each run, thus eliminating the need of a real-time link to the low side controller 809. 804 represents one-way communication links between modules. 806 represents two-way communication links between modules.

In one embodiment of time-domain multiplexing schemes, the high side MCU supplies power to each heater zone power supply line sequentially. Only one power supply line is connected to a power supply at the same time. During the time when one power supply line is powered, the high side MCU may keep any or all power return lines connected to the floating reference for a portion of this duration. A heater zone is turned on when at least one of the power supply lines connected to this heater zone is connected to the power supply, and at least one of the power return lines connected to this heater zone is connected to the floating reference. The average power of a heater zone is directly proportional to the average duration it is turned on. Alternatively, during the time when one power supply line is powered, the high side MCU may keep any or all power return lines connected to the floating reference for this entire duration and regulate the power transmitted to each heater zone that is turned on.

For example, with a 10-by-10 grid of heater zones, heater zones in row number N are connected to a power supply line number N; heater zones in column number M are connected to a power return line number M. The high side MCU may control heating such that each of the power supply lines is connected to the power supply for 100 ms, sequentially. For example, during the 100 ms of time when power supply line number 3 is connected to the power supply, the MCU is operable to connect power return lines number 7, 8, and 9 to the floating reference for 10, 50 and 100 ms, respectively, as directed by the particular heating requirement during this 100 ms. Thus, the heater zone in row number 3 and column number 7 has a duty cycle of 1%; the heater zone in row number 3 and column number 8 has a duty cycle of 5%; the heater zone in row number 3 and column number 9 has a duty cycle of 10%. In this particular example, the maximum peak power for each heater zone would be set to ten times the average maximum power desired.

In order to prevent detectable temperature modulation, the switching frequencies and the entire multiplexing scheme are preferably sufficiently rapid that each heater zone gets addressed frequently (at least 1 Hz). Additional loop control may be implemented using feedback data from one of more temperature sensors. Voltage and current sensors can also be implemented if desired. These sensors can be configured to measure parameters such as temperatures on different locations on the substrate and power of heater zones. These measured parameters are sent to the control and power circuit to be compared with set targets of these parameters so that the control and power circuit can adjust the power delivered to the heater zones accordingly in order to minimize the difference between the measured parameters and their set targets.

While a heating plate, methods of manufacturing the heating plate, a substrate support assembly comprising the heating plate, and a method of using a plasma processing chamber containing the substrate support assembly have been described in detail with reference to specific embodiments thereof, it will be apparent to those skilled in the art that various changes and modifications can be made, and equivalents employed, without departing from the scope of the appended claims. For instance, the substrate support assembly can include temperature sensors for monitoring substrate temperature, a power feed arrangement to power the ESC with desired clamping voltage, a lifting pin arrangement for raising and lowering a substrate, a heat transfer gas feed arrangement for supplying gas such as helium to the underside of the substrate, a temperature controlled liquid feed arrangement to supply heat transfer liquid to the cooling plate, a power feed arrangement to individually power primary heaters above or below the planar heater zones, a power feed arrangement to supply RF power at one or more frequencies to a lower electrode incorporated in the substrate support assembly, and the like.

We claim:

1. A heating plate configured to provide radial and azimuthal temperature control of a semiconductor substrate supported on a semiconductor substrate support in a processing chamber, comprising:
   a first layer having an array of heater zones operable to tune a spatial temperature profile on the semiconductor substrate, the heater zones powered by two or more power supply lines and two or more power return lines wherein each power supply line is connected to at least two of the heater zones and each power return line is connected to at least two of the heater zones, each heater zone not larger than four device dies being manufactured on the semiconductor substrate, and
   a second layer having one or more primary heaters operable to provide mean temperature control of the semiconductor substrate during processing in the processing chamber.

2. A substrate support comprising:
   a heating plate configured to provide radial and azimuthal temperature control of a semiconductor substrate supported on a semiconductor substrate support in a processing chamber, comprising:
   a first layer having an array of heater zones operable to tune a spatial temperature profile on the semiconductor substrate, the heater zones powered by two or more power supply lines and two or more power return lines wherein each power supply line is connected to at least two of the heater zones and each power return line is connected to at least two of the heater zones, each heater zone not larger than four device dies being manufactured on the semiconductor substrate, and a second layer having one or more primary heaters operable to provide mean temperature control of the semiconductor substrate during processing in the processing chamber;

a switching device which independently supplies power to each one of the heater zones via one of the power supply lines and one of the power return lines to provide time-averaged power to each of the heater zones by time divisional multiplexing of the switches; and a temperature controlled and radio frequency (RF) powered base plate beneath the heating plate and high side circuitry housed in local faraday cage under the base plate.

3. A heating plate configured to provide radial and azimuthal temperature control of a semiconductor substrate supported on a semiconductor substrate support in a processing chamber, comprising:

a first layer having an array of heater zones operable to tune a spatial temperature profile on the semiconductor substrate, the heater zones powered by two or more power supply lines and two or more power return lines wherein each power supply line is connected to at least two of the heater zones and each power return line is connected to at least two of the heater zones, each heater zone not larger than four device dies being manufactured on the semiconductor substrate;

a second layer having one or more primary heaters operable to provide mean temperature control of the semiconductor substrate during processing in the processing chamber;

the heating plate includes a first electrically insulating layer with planar heater zones distributed laterally across the first electrically insulating layer and comprising at least first, second, third and fourth planar heater zones, each planar heater zone having one or more heater elements;

the power supply lines comprise at least a first electrically conductive power supply line electrically connected to the first and second planar heater zones and a second electrically conductive power supply line electrically connected to the third and fourth planar heater zones; and the power return lines comprise at least a first electrically conductive power return line electrically connected to the first and third planar heater zones and a second electrically conductive power return line electrically connected to the second and fourth planar heater zones.

4. The heating plate of claim 1, wherein the heating plate is incorporated in a substrate support which includes temperature sensors configured to measure temperature at locations on the semiconductor substrate; and a control and power circuit connected to the array of heater zones and configured to receive the measured parameters from the temperature sensors and adjust power delivered to the heater zones to minimize differences between the measured parameters and set targets.

5. The substrate support of claim 2, further comprising:
an isolator connected to electric ground,
wherein the switching device is connected to the isolator.

6. The substrate support of claim 5, wherein the switching device is located in a plasma etching chamber.

7. The substrate support of claim 5, wherein the isolator is an isolation transformer that isolates the switching device from RF.

8. A heating plate configured to provide radial and azimuthal temperature control of a semiconductor substrate supported on a semiconductor substrate support in a processing chamber, comprising:

a first layer having an array of heater zones operable to tune a spatial temperature profile on the semiconductor substrate, the heater zones powered by two or more power supply lines and two or more power return lines wherein each power supply line is connected to at least two of the heater zones and each power return line is connected to at least two of the heater zones, each heater zone not larger than four device dies being manufactured on the semiconductor substrate;

a second layer having one or more primary heaters operable to provide mean temperature control of the semiconductor substrate during processing in the processing chamber;

the heater zones are supported on a first electrically insulating layer;

the second layer is arranged above or below the first electrically insulating layer; and the one or more primary heaters are electrically insulated from the array of heater zones, the power supply lines, and the power return lines.

9. The substrate support of claim 2, wherein the switching device is a high side controller that floats at an RF potential, the substrate support further comprising:
an optical coupler connected to the high side controller for digital communication with a low-side controller.

10. The substrate support of claim 2, wherein the switching device connects at least one power return line to a floating reference.

11. The substrate support of claim 2, wherein the switching device is configured to turn on one of the heater zones when at least one power supply line connected to the heater zone is connected to a power supply, and at least one power return line connected to the heater zone is connected to a floating reference.

12. The substrate support of claim 2, wherein the switching device connects all power return lines to a floating reference.

13. The substrate support of claim 2, wherein the switching device is configured to address each heater zone of the array of heater zones at a frequency of at least 1 Hz.

14. A substrate support comprising the heating plate of claim 1, wherein the substrate support includes sensors configured to measure parameters on different locations on the substrate support and power of the heater zones.

15. The substrate support of claim 14, wherein the sensors include at least one of voltage and current sensors.

16. The substrate support of claim 14, wherein the measured parameters include at least temperature measurements.

17. The substrate support of claim 2, wherein the switching device is configured to maintain a connection between all power return lines and a floating reference during a time when one power supply line is powered and regulate power transmitted to heat a heater zone that is turned on.

18. A substrate support, comprising:
a heating plate configured to provide radial and azimuthal temperature control of a semiconductor substrate supported on a semiconductor substrate support in a processing chamber, comprising:

a first layer having an array of heater zones operable to tune a spatial temperature profile on the semiconductor substrate, the heater zones powered by two or more power supply lines and two or more power return lines wherein each power supply line is connected to at least two of the heater zones and each power return line is connected to at least two of the heater zones, each heater zone not larger than four device dies being manufactured on the semiconductor substrate, and a second layer having one or more primary heaters operable to provide mean temperature control of the semiconductor substrate during processing in the processing chamber; and an electrostatic clamping (ESC) layer above the heating plate.

19. The substrate support of claim 18, further comprising a radio frequency (RF) powered base late beneath the heating plate.

20. The heating plate of claim 1, wherein the heater zones comprise at least 100 independently controllable heater zones embedded in ceramic material.

* * * * *